United States Patent
Hsu et al.

(10) Patent No.: US 12,538,744 B2
(45) Date of Patent: Jan. 27, 2026

(54) WAFER TRANSPORTATION

(71) Applicant: Taiwan Semiconductor Manufacturing Company, Ltd., Hsin-Chu (TW)

(72) Inventors: Chieh Hsu, Hsinchu (TW); Guancyun Li, Miaoli county (TW); Ching-Jung Chang, Taichung (TW); Chi-Feng Tung, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 902 days.

(21) Appl. No.: 17/832,605

(22) Filed: Jun. 4, 2022

(65) Prior Publication Data

US 2023/0395415 A1 Dec. 7, 2023

(51) Int. Cl.
*B65G 17/12* (2006.01)
*H01L 21/677* (2006.01)

(52) U.S. Cl.
CPC ........ *H01L 21/67724* (2013.01); *B65G 17/12* (2013.01); *H01L 21/6773* (2013.01); *H01L 21/67733* (2013.01)

(58) Field of Classification Search
CPC ........... H01L 21/67724; H01L 21/6773; H01L 21/67736; B65G 17/12
See application file for complete search history.

(56) References Cited

U.S. PATENT DOCUMENTS

| | | | | |
|---|---|---|---|---|
| 7,672,748 | B2 * | 3/2010 | Chik | G05B 19/41895 700/112 |
| 7,925,380 | B2 * | 4/2011 | Yu | G05B 19/4189 700/121 |
| 9,852,934 | B2 | 12/2017 | Hsieh et al. | |
| 9,901,210 | B2 * | 2/2018 | Chan | G05B 19/41815 |
| 10,056,281 | B2 * | 8/2018 | Ogawa | H01L 21/67393 |
| 10,108,095 | B2 | 10/2018 | Huang et al. | |
| 10,262,882 | B2 | 4/2019 | Hsieh et al. | |
| 10,658,215 | B2 | 5/2020 | Lee et al. | |
| 10,790,177 | B2 | 9/2020 | Lin et al. | |

(Continued)

FOREIGN PATENT DOCUMENTS

JP 6849074 B2 * 3/2021 ............ B65G 1/04

*Primary Examiner* — Patrick H Mackey
(74) *Attorney, Agent, or Firm* — HAYNES AND BOONE, LLP

(57) ABSTRACT

System and method for cross-fab wafer transportation are provided. An exemplary system includes a first control unit coupled to an associated first automatic material handling system (AMHS), the first AMHS includes a first overhead transport (OHT) track comprising a first portion and a first vehicle movable along the first OHT track and carrying a container, the container is operable to carry semiconductor wafers therein. The system includes a second control unit coupled to an associated second AMHS, the second AMHS includes a second OHT track comprising a second portion adjacent to the first portion and a second vehicle movable along the second OHT track. When the first vehicle is within the first portion of the first OHT track and the second vehicle is within the second portion of the second OHT track, the first and second vehicles are operable to transfer the container directly from the first vehicle to the second vehicle.

20 Claims, 12 Drawing Sheets

(56) References Cited

U.S. PATENT DOCUMENTS

| | | |
|---|---|---|
| 2010/0138016 A1 | 6/2010 | Chen et al. |
| 2013/0061772 A1* | 3/2013 | Chen ................ H01L 21/67733 104/91 |
| 2023/0202759 A1* | 6/2023 | Bang ................ H01L 21/67733 700/218 |
| 2024/0021456 A1* | 1/2024 | Hsu ................... H01L 21/67733 |

* cited by examiner

WAFER TRANSPORTATION

BACKGROUND

The manufacture of semiconductor devices involves the performance of a series of process steps using a variety of high-tech production and metrology tools in a certain order and often within a certain period of time. The primary function of a wafer logistics system in a wafer fabrication facility, or "fab," is to deliver the wafers to each of the tools at the right time, as well as to track the location and status of the wafers throughout the process. Automated material handling systems ("AMHS") are applied to wafer fabs to carry out the automated functions more efficiently, consistently, and safely than can be done via manual means. The fabrication process often results in the need for cross-phase transportation within a single fab and/or cross-fab transportation between fabs.

When a wafer carrier (e.g., a front opening unified pod ("FOUP") is to be transferred, a manufacturing execution system ("MES") determines to which destination in the fab the wafer carrier should be transferred. Once the destination decision has been made, the MES sends a transfer request to a material control system ("MCS"), which calculates a detailed transportation route using a route search engine and then notifies a transfer manager to execute the transfer step-by-step. However, typical MES and MCS systems are limited to a single fab and cannot process cross-fab and/or cross-AMHS transportation requests. The MES and MCS systems of one fab are often unable to communicate with the AMHS of a separate fab. In that regard, different fabs may have different AMHS vendors and communication protocols. Although existing systems and methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
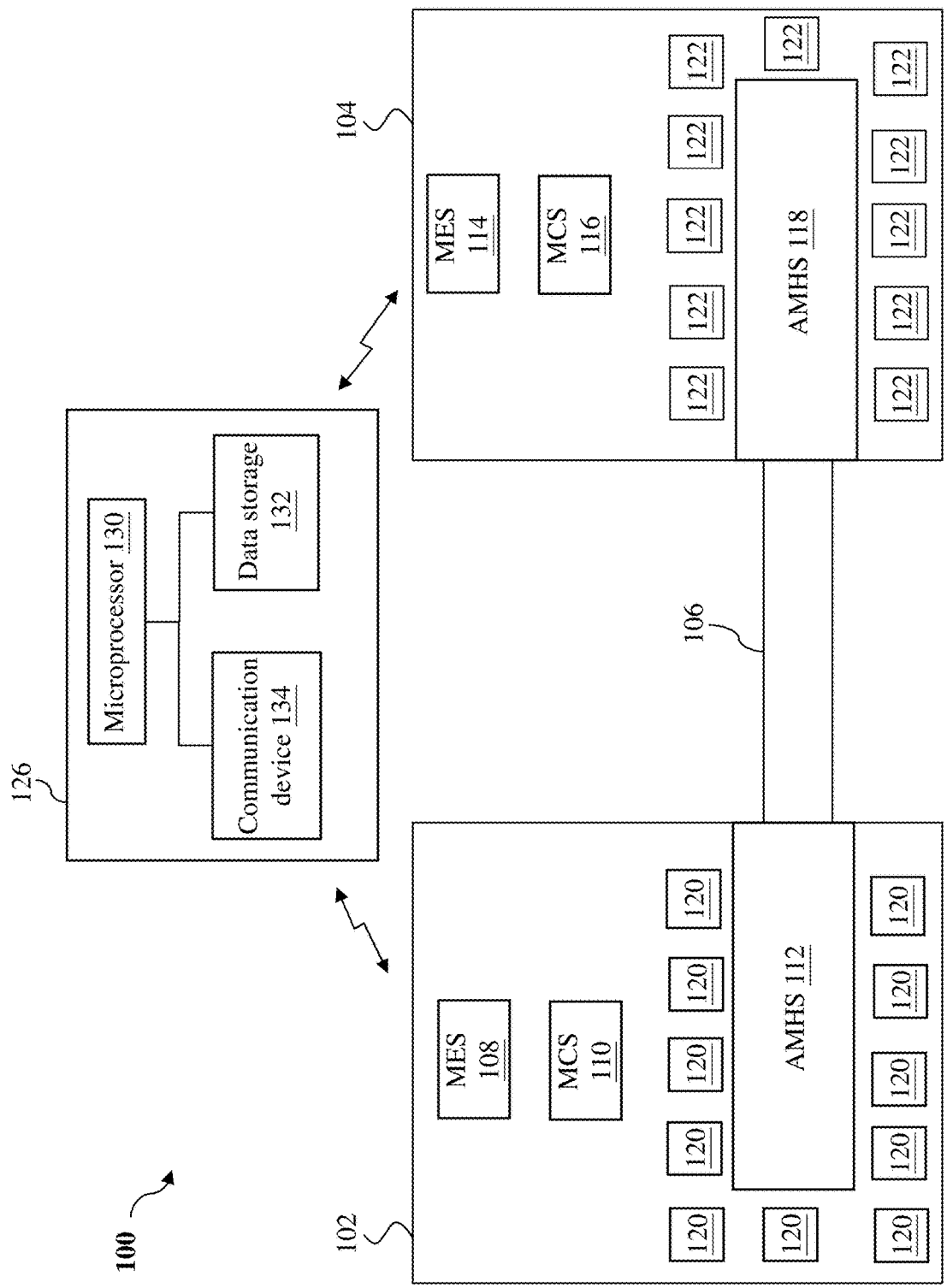
FIG. 1 illustrates a simplified manufacturing facility, according to one embodiment of the present disclosure.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

It is understood that the following disclosure provides many different embodiments, or examples, capable of implementing different features. Specific examples of components and arrangements are described below to simplify and thus clarify the present disclosure. These are, of course, merely examples and are not intended to be limiting. In many instances, the features of one embodiment may be combined with the features of other embodiments. In addition, the present disclosure may repeat reference numerals and/or letters in the various exemplary embodiments. This repetition is for the purpose of simplicity and clarity and does not in itself dictate a relationship between the various embodiments and/or configurations discussed.

A semiconductor foundry may include a number of fabs. During processing, a wafer may be transferred between the number of fabs for different steps of the manufacturing process. A "cross-fab transfer" involves the transfer of a wafer carrier (e.g., a front opening unified pod "FOUP") from one fab to another. The two fabs may be connected by a bridging area. A "cross-AMHS transfer" involves the transfer of a wafer carrier (e.g., FOUP), from one automated material handling system ("AMHS") to another AMHS, regardless of whether the AMHSs are separate systems within a single fab or systems in separate fabs. Each fab may include multiple phases. A "cross-phase transfer" involves the transfer of a wafer carrier, or FOUP, from one phase to another. Each phase of a fab includes a plurality of bays that may include processing tools or equipment. The equipment within each bay may be interconnected by an intrabay overhead transport ("OHT") system. The bays may be interconnected with the other bays via an interbay OHT system. As will be familiar to those of ordinary skill in the relevant art, the intrabay OHT systems and the interbay OHT system includes overhead tracks on which OHT vehicles transport FOUPs containing lots of wafers to be processed to and from the equipment of the bays, often via stockers.

In some technologies, a "cross-fab" transfer may include placing interface devices (e.g., stockers) in the bridging area and selecting an interface device that is accessible by both OHT vehicles of a first fab and OHT vehicles of a second fab, configuring a vehicle of a first OHT system to take the wafer carrier from the processing tools or equipment of the first fab to the selected interface device that is used to temporarily hold the wafer carrier, and configuring a vehicle of a second OHT system to take the wafer carrier from the selected interface device to the processing tools or equipment of the second fab. Such kind of "cross-fab" transfer increases transportation volume and may cause traffic jam. In addition, more clean room space is needed in order to arrange interface devices to implement the "cross-fab" transfer. A "cross-AMHS transfer" and a "cross-phase transfer" also encounter similar issues.

The present disclosure provides systems and methods of performing the cross-fab transfer. The present disclosure may also be applied for a cross-phase transfer and a cross-AMHS transfer. In an embodiment, a system includes a first OHT system and a second OHT system. A first portion of a track of the first OHT system is in proximity of and in parallel with a second portion of a track of the second OHT system. A vehicle of the first OHT system is operable to take the wafer carrier from the equipment in the first fab. When the vehicle of the first OHT system is travelling along the first portion and a vehicle of the second OHT system is travelling along the second portion, the vehicle of the second OHT system is configured to take the wafer carrier directly from the vehicle of the first OHT system. As such, the cross-fab transfer process is simplified. In addition, the system doesn't need interface devices arranged in the bridging area. Also, the traffic jam caused by placing the wafer carrier on the interface devices and taking the wafer carrier from the interface devices may be reduced.

FIG. 1 illustrates a portion of a simplified manufacturing facility 100. In the present embodiments, the manufacturing facility 100 includes a fab 102 and a fab 104 connected by a bridging area 106. The fab 102 includes a manufacturing execution system ("MES") 108, a material control system (MCS) 110, and an automated material handling system (AMHS) 112. The fab 104 includes a MES 114, a MCS 116, and a AMHS 118. It is understood that the MESs 108 and 114, the MCSs 110 and 116, and the AMHSs 112 and 118 may include a number of components as is known in the art. For example, but without limitation, each of the AMHSs 112 and 118 may include a number of control modules, such as a reticle stocker controller, a stocker controller, an overhead buffer controller, an inter-bay OHS controller, an intra-bay OHT controller, and/or a lifter controller. The AMHSs 112 and 118 may include additional, fewer, and different control modules in some embodiments. It is understood that the manufacturing facility 100 may have other numbers of fabs.

The bridging area 106 represents the connection between the AMHSs 112 and 118, and/or between the fabs 102 and 104. In some embodiments, the bridging area 106 may be a defined location within overhead transport ("OHT") tracks/rails. The bridging area 106 serves as the connection between the AMHSs such that a wafer carrier may be passed from one AMHS to another. Thus, in some embodiments, the bridging area 106 is an area where two or more AMHSs may operate together. In this manner, the wafer carrier may be transferred across multiple AMHSs by passing control of the wafer carrier from one AMHS to another at the bridging area 106. The bridging area 106 may facilitate transferring a wafer carrier from the first AMHS to the second AMHS, from the second AMHS to the first AMHS, or both. In some embodiments, the bridging area 106 may connect more than two AMHSs to one another.

The manufacturing facility 100 also includes a unified control unit 126. The unified control unit 126 is configured to communicate with each of the fabs 102 and 104 and facilitate and/or organize transportation of wafers between the fabs 102 and 104. In that regard, the unified control unit 126 may act as a server for receiving and providing information and/or instructions to each of the fabs. The unified control unit 126 may also act as a communication link between fabs such that the MES, MCS, and/or other systems of each fab may communicate with the systems of another fab. The unified control unit 126 may include hardware, software, or combinations of hardware and software. In some embodiments, the unified control unit 126 is a stand-alone unit separate from the MES, MCS, and other systems of each fab. In other embodiments, the unified control unit 126 may be a component or part of at least one of the fabs. In at least some embodiments, communication between the unified control unit 126 and the fabs 102 and 104 is by Common Object Request Broker Architecture ("CORBA"). Further, communication between components of the unified control unit 126 and communication between components of the fabs 102 and 104 may utilize CORBA. However, in other embodiments other communication protocols and/or middleware may be used.

In the present embodiments, the unified control unit 126 is configured to synchronize the MES 108 and 114, the MCSs 110 and 116, and/or the AMHSs 112 and 118 of the different fabs 102 and 104 to facilitate movement of a wafer carrier among the different fabs. In an embodiment, the unified control unit 126 is configured to facilitate transportation of a wafer carrier between the equipment 120 and equipment 122 of the various AMHSs 112 and 118, respectively. The equipment 120 and equipment 122 each may include processing tools, stockers, and/or other equipment. In the current embodiment, wafer lots are transferred via a wafer carrier (e.g., FOUP) between the equipment 120 and equipment 122. In that regard, the AMHSs 112 and 118 may be from different vendors.

In embodiments represented in FIG. 1, the unified control unit 126 includes a microprocessor 130 configured to perform operations to execute the wafer transfer between different fabs. The microprocessor 130 may receive and transmit data to the MCSs 110 and 116 of the fabs 102 and 104, respectively. In particular, the microprocessor 130 is configured to communicate with each of the MCSs 110 and 116 such that a cross-AMHS transfer can be synchronized across the different AMHSs 112 and 118 by sending appropriate signals to the MCSs. For example, the microprocessor 130 determines whether a vehicle associated with the AMHS 112 may directly transfer the wafer to a vehicle associated with the AMHS 118 without using interface devices in the bridging area.

The microprocessor 130 is coupled to a data storage 132. The data storage 132 may include program instructions to generate commands to the MCSs 110 and 116. For example, the data storage 132 may store instructions that, when executed by the microprocessor 130, cause the microprocessor 130 to perform operations to provide sub-route requests to each of the MCSs. Detailed description of the operations that may be performed by the microprocessor 130 will be described with reference to FIGS. 2A-2E and FIG. 3. The data storage 132 may include a non-volatile memory (NVM), a database or a number of databases containing information regarding the MES and/or AMHS mappings for each fab, the available transfer patterns for each fab, available transfer patterns between fabs, and/or other information related to transferring wafers within each fab/phase and between the plurality of fabs/phases.

The transfer patterns may represent the available routes for transferring a FOUP between a first position in a first AMHS and a second position in a second AMHS. In some embodiments, the transfer patterns are dynamic and may be updated by factors such as static and dynamic traffic conditions, lot information, lot priority, available routes, route distances, maintenance schedules, and/or other factors. The transfer of a FOUP between AMHSs may be broken down into sub-routes comprised of transfers within a single AMHS. In some embodiments, the route of a cross-fab transfer may be broken down into sub-routes comprised of transfers within a single AMHS and transfers across a bridging area. Multiple sub-routes may be linked together to create a full transfer route. In some embodiments, the transfer patterns may be based on available combinations of sub-routes for achieving the desired transfer. The microprocessor 130 may be configured to synchronize the multiple AMHSs to facilitate the transfer of the FOUP. In some embodiments, to execute a cross-AMHS transfer, the microprocessor 130 may be configured to provide a selected full transfer route which is formed by a number of sub-routes and then communicate sub-routes requests associated with the corresponding sub-routes with the corresponding AMHSs for execution. By coordinating the AMHSs, the cross-fab transfer request can be properly executed.

The MES and AMHS mapping provide static information regarding the available routing within the individual fabs and AMHSs that is combined to form a global mapping across the multiple MESs and AMHSs. In that regard, the MES and AMHS mapping may include the location of various tools and equipment among the fabs and AMHSs that can be utilized in route planning and assessment. While in some of the embodiments described below, there appears to be a single route between positions, this is simply for the sake of clarity and example and should not be considered limiting. Rather, it is fully contemplated that there could be multiple routes for transferring a FOUP between AMHSs from one position to another position.

While the manufacturing facility 100 has been described as having a particular combination of components, it is understood that the manufacturing facility 100 may have fewer or greater components as would be apparent to one skilled in the art. For example, the unified control unit 126 may also include a user interface engine coupled to the microprocessor 130. For example, a user may input data through a user interface to select/configure different settings or different parameters. In addition, the functions of some of the various components may be combined into a single component and/or functions of a single component may be split out into multiple components. In other embodiments, the manufacturing facility 100 may include additional fabs in communication with the unified control unit 126. Cross-fab transportation can be extended to the additional fabs in a manner similar to that described above with respect to fabs 102 and 104.

FIGS. 2A, 2B, 2C, and 2D are simplified fragmentary schematic diagrams illustrating different stages of a cross-fab wafer transportation process according to one embodiment of the present disclosure. A "cross-fab transfer job" involves the transfer of a wafer carrier 202, or FOUP 202, from one of the fabs 102, 104, to the other. The wafer carrier 202 may contain wafers 204 to be transferred. In the present embodiments, the wafer carrier 202 that contains wafers 204 will be transferred from the fab 104 to the fab 102. The wafer transfer between the fab 102 and the fab 104 may be accomplished by the AMHS of the fab 104, such as an OHT system 209, carrying the FOUP 202 to the bridging area 106. Then the FOUP 202 is transferred directly from the vehicle 212, rather than using an interface device such as a stocker, to the AMHS of the fab 102, such as an OHT system 206.

Figure 2A:
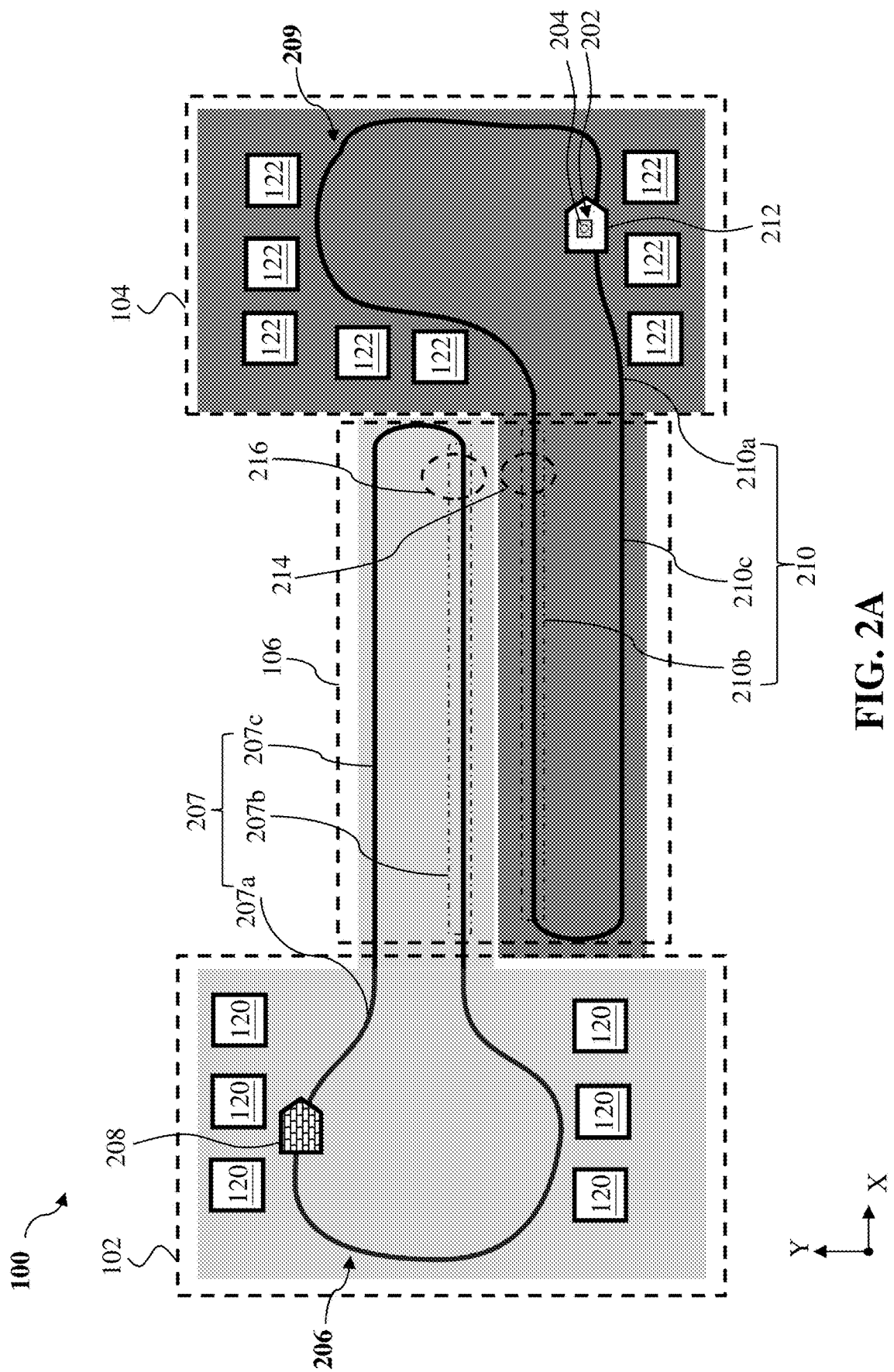
FIGS. 2A, 2B, 2C, and 2D are simplified fragmentary schematic diagrams illustrating different stages of a cross-fab wafer transportation process, according to one embodiment of the present disclosure.

Referring to FIG. 2A, the fab 102 may include a number of bays, and each bay includes equipment 120 (e.g., processing tools, stockers, or other equipment). The equipment 120 within each bay of the fab 102 is interconnected in by an intrabay overhead transport ("OHT") system, and the bays of the fab 102 may be interconnected via an interbay OHT system. The fab 104 may include a number of bays, and each bay includes equipment 122 (e.g., processing tools, stockers, or other equipment). Similarly, the equipment 122 within each bay of the fab 104 is interconnected in by another intrabay overhead transport ("OHT") system, and the bays of the fab 104 may be interconnected via another interbay OHT system. The intrabay OHT system and the interbay OHT system may be collectively or separately referred to as an OHT system.

In the present embodiments, the OHT system 206 includes overhead tracks or overhead rails (such as overhead track 207) on which first-type OHT vehicles (such as vehicle 208) transport FOUPs containing wafers to be processed to and from equipment 120. The OHT system 209 includes overhead tracks or overhead rails (such as overhead track 210) on which second-type OHT vehicles (such as vehicle 212) transport FOUPs containing wafers to be processed to and from equipment 122. The OHT system 206 and the OHT system 209 may be provided by different vendors. In embodiments represented in FIG. 2A, the overhead track 207 of the OHT system 206 includes a portion 207a arranged within the fab 102 and a rest (i.e., the combination of the portion 207b and the portion 207c) arranged within the bridging area 106. That is, the service range of the OHT system 206 includes both the fab 102 and a portion of the bridging area 106. The overhead track 210 of the OHT system 209 includes a portion 210a arranged within the fab 104 and a rest (i.e., the combination of the portion 210b and the portion 210c) arranged within the bridging area 106. That is, the service range of the OHT system 209 includes both the fab 104 and a portion of the bridging area 106. In the present embodiments, the portion 207b of the overhead track 207 is in proximity of the portion 210b of the overhead track 210. More specifically, the portion 207b of the overhead track 207 is adjacent to and in parallel with the portion 210b of the overhead track 210.

As described above, the manufacturing facility 100 includes the unified control unit 126. In response to a cross-fab transfer request, the microprocessor 130 may select an appropriate route for transferring the FOUP 202 that carrying the wafer 204 from an equipment 122 in the fab 104 to a target equipment 120 in the fab 102 and communicates the sub-routes to the MCS 110 and the MCS 116, respectively. After receiving signals (e.g., information related to the sub-route) from the MCS 116, the vehicle 212 is configured to take the FOUP 202 from the equipment 122 (e.g., a stocker) in the fab 104 and move along the overhead track 210 to arrive at a predetermined location 214 at a predetermined time or within a predetermined duration. The predetermined location 214 is within the portion 210b of the overhead track 210. After receiving instructions from the MCS 110, the vehicle 208 starts travelling along the overhead track 207 to arrive at a predetermined location 216 at the same predetermined time or within the same predetermined duration. The predetermined location 216 is within the portion 210b of the overhead track 207. In some embodiments, the predetermined location 214 has coordinates (x1, y1, z1), and the predetermined location 216 has coordinates (x2, y2, z2). In one example, x1 is substantially equal to x2, z1 is substantially equal to z2, and y1 is different from y2.

Figure 2B:
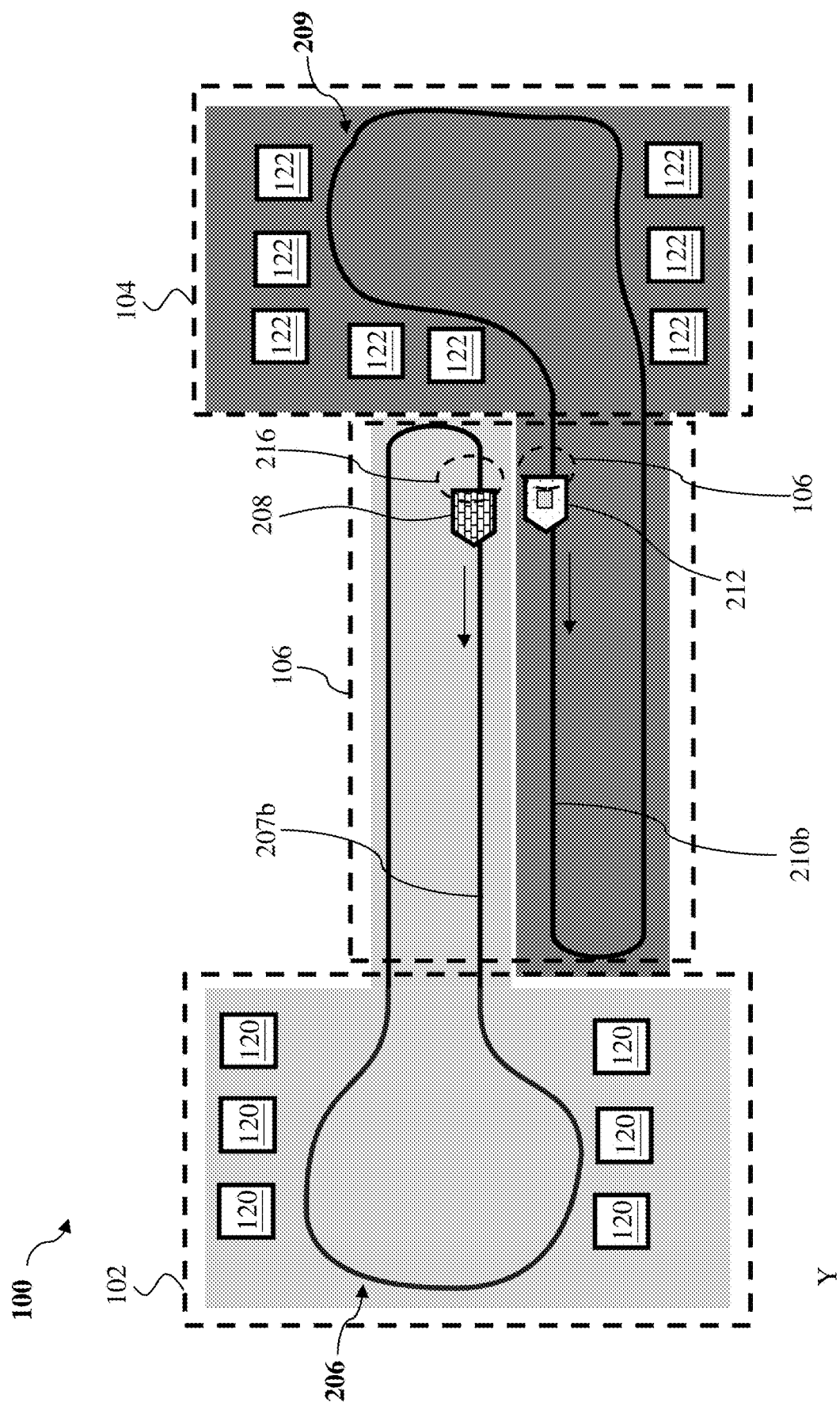

Referring now to FIG. 2B, after travelling along the respective overhead track for a duration, the vehicle 208 arrives at the predetermined location 214 at the predetermined time and the vehicle 208 arrives at the predetermined location 216 substantially at the same time. In the present embodiments, to reduce traffic jam, after arriving at the respective predetermined locations 214 and 216, both the vehicles 208 and 212 continue travelling along its respective track. More specifically, after arriving at the respective predetermined locations 214 and 216, the vehicle 212 moves on the portion 210b of the overhead track 210 along the –X direction at a first speed, and the vehicle 208 moves on the portion 207b of the overhead track 207 along the –X direction at a second speed. In an embodiment, the first speed is equal to the second speed such that the vehicle 208 and the vehicle 212 are relatively stationary. In some embodiments, a speed difference between the first speed and the second speed is less than a predetermined threshold (e.g., 0.1 m/second) such that the vehicle 208 and the vehicle 212 are deemed as relatively stationary.

After both the vehicle 208 and the vehicle 212 arrive at its respective predetermined location and are relatively stationary, an alignment module on the vehicle 212 may determine whether the vehicle 208 is aligned with the vehicle 212. In some embodiments, the alignment module may include an image sensor, a laser sensor, a tilt-angle sensor, other suitable devices, and/or combinations thereof. The vehicle 208/212 will be described in further detail with reference to FIGS. 4, 5A-5C, 6 and 7.

In some implementations, due to, for example, different route distances, the vehicle 208 and/or the vehicle 212 may travel at a different speed before arriving at the respective predetermined location 214/216. For instance, before arriving at the predetermined location 214, the vehicle 212 may travel at a third speed that is higher than the first speed. In some other implementations, due to traffic jam, the vehicle 208 and/or the vehicle 212 may arrive at its respective predetermined location later than the predetermined time. For example, the vehicle 212 arrives at the predetermined location 214 at the predetermine time and the vehicle 208 is still on its way to the predetermined location 216. In such situation, the vehicle 212 may communicate with its MCS 116 to report its location, the MCS 116 may then communicate with the unified control unit 126 to report the status of the vehicle 212. In some situations, the unified control unit 126 may instruct the vehicle 212 to stop moving and wait the vehicle 208 at the predetermined location 214; in some other situations, the unified control unit 126 may communicate with MCS 110 such that the MCS 110 may assign another available vehicle to arrive at the predetermined location 216 to reduce the impact of the traffic jam. The unified control unit 126 may then communicate with the MCS 116 such that the vehicle 212 is configured to finish the transfer with the updated vehicle.

Figure 2C:
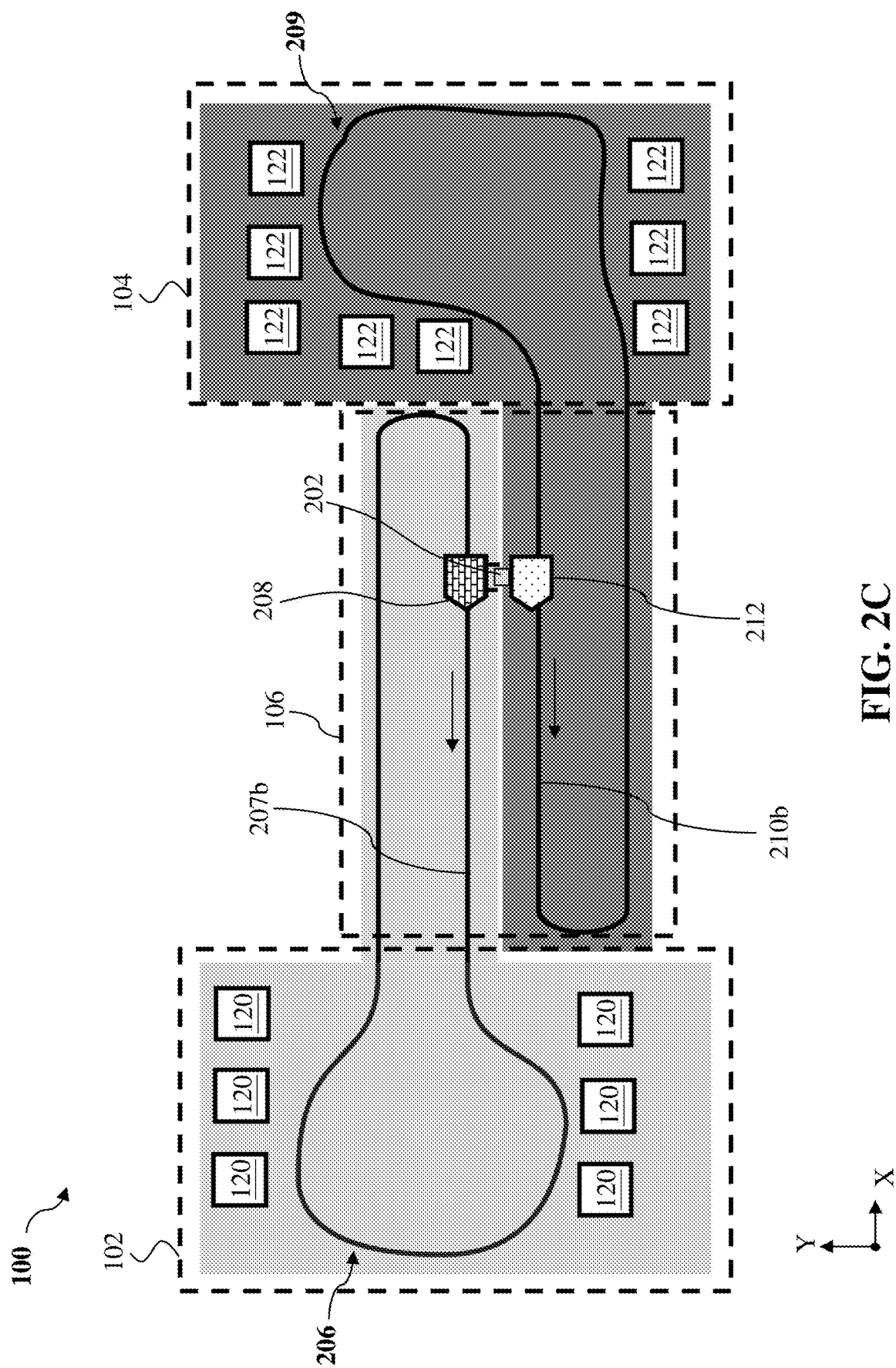

Referring now to FIG. 2C, after the vehicle 208 and the vehicle 212 are aligned and relatively stationary, the FOUP 202 is transferred directly from the vehicle 212 to the vehicle 208. In an exemplary embodiment, the vehicle 212 includes a tray used to hold the FOUP 202. After the vehicle 208 and the vehicle 212 are aligned and relatively stationary, while holding the FOUP 202, the tray of the vehicle 212 may be configured to slide out from the main body of the vehicle 212. The vehicle 208 includes at least a gripper that is configured to take the FOUP 202 from the tray of the vehicle 212. The gripper of the vehicle 208 may then put the FOUP 202 on the tray of the vehicle 208. Exemplary structures of the vehicles 208 and 212 will be described in further detail with reference to FIGS. 4 and 5A-5C. In some embodiments, the vehicle 208 is operable to take the FOUP 202 directly from the vehicle 212 when both the vehicle 212 and the vehicle 208 are stationary.

Figure 2D:
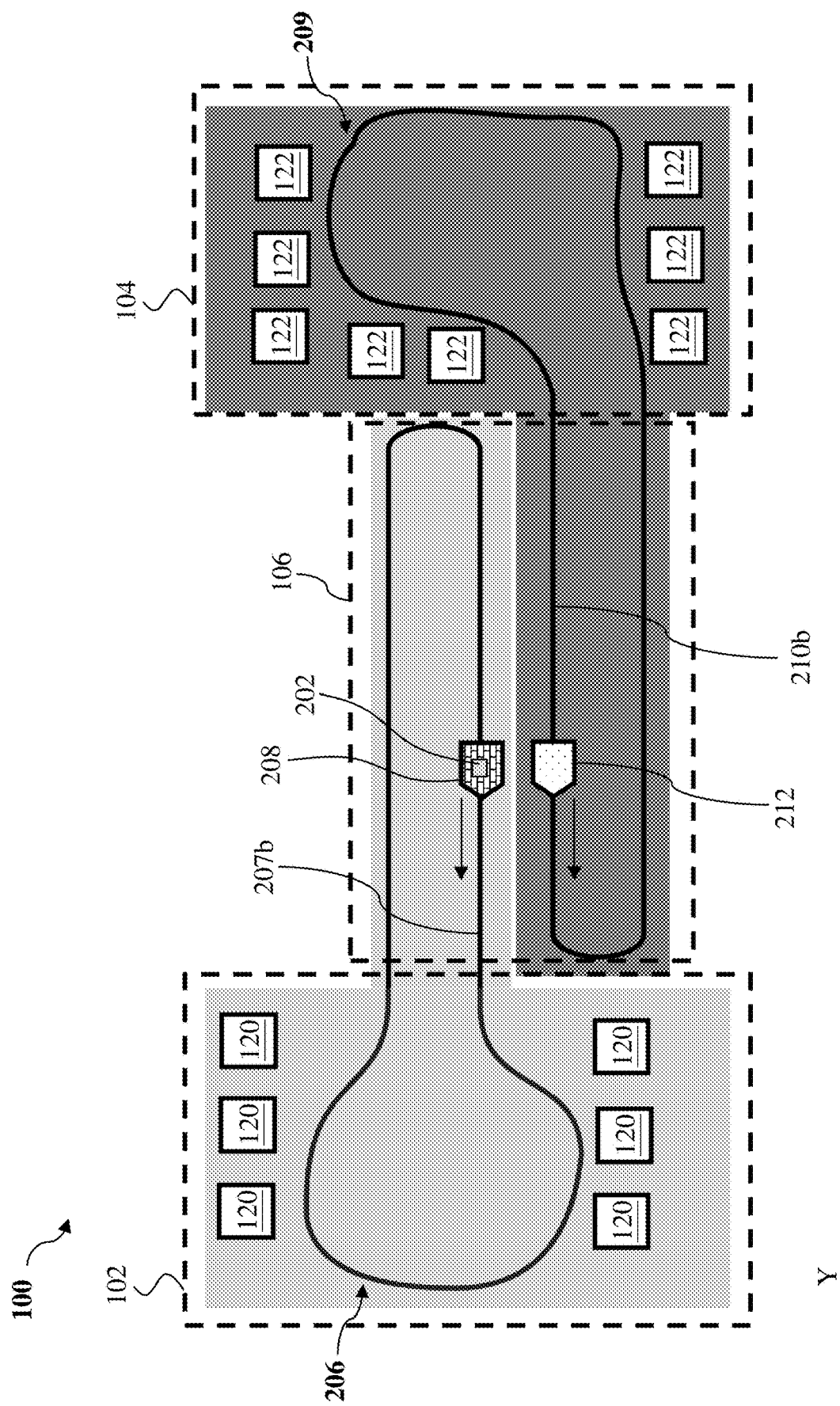

Referring now to FIG. 2D, after the FOUP 202 is transferred directly from the vehicle 212 to the vehicle 208, the vehicle 208 continues traveling along the overhead track 207 until carrying the FOUP 202 to the target position in the fab 102. The cross-fab transfer process is thus finished without arranging an interface device (e.g., stocker) between the OHT system 206 and the OHT system 209 to temporarily hold the FOUP 202. As such, the effective area that may be used to place processing tools may be increased. Since the cross-fab transfer process is simplified by reducing processes such as temporality positioning the FOUP 202 on the interface device and taking the FOUP 202 from the same interface device, traffic jams caused by those processes may be advantageously reduced.

Figure 2E:
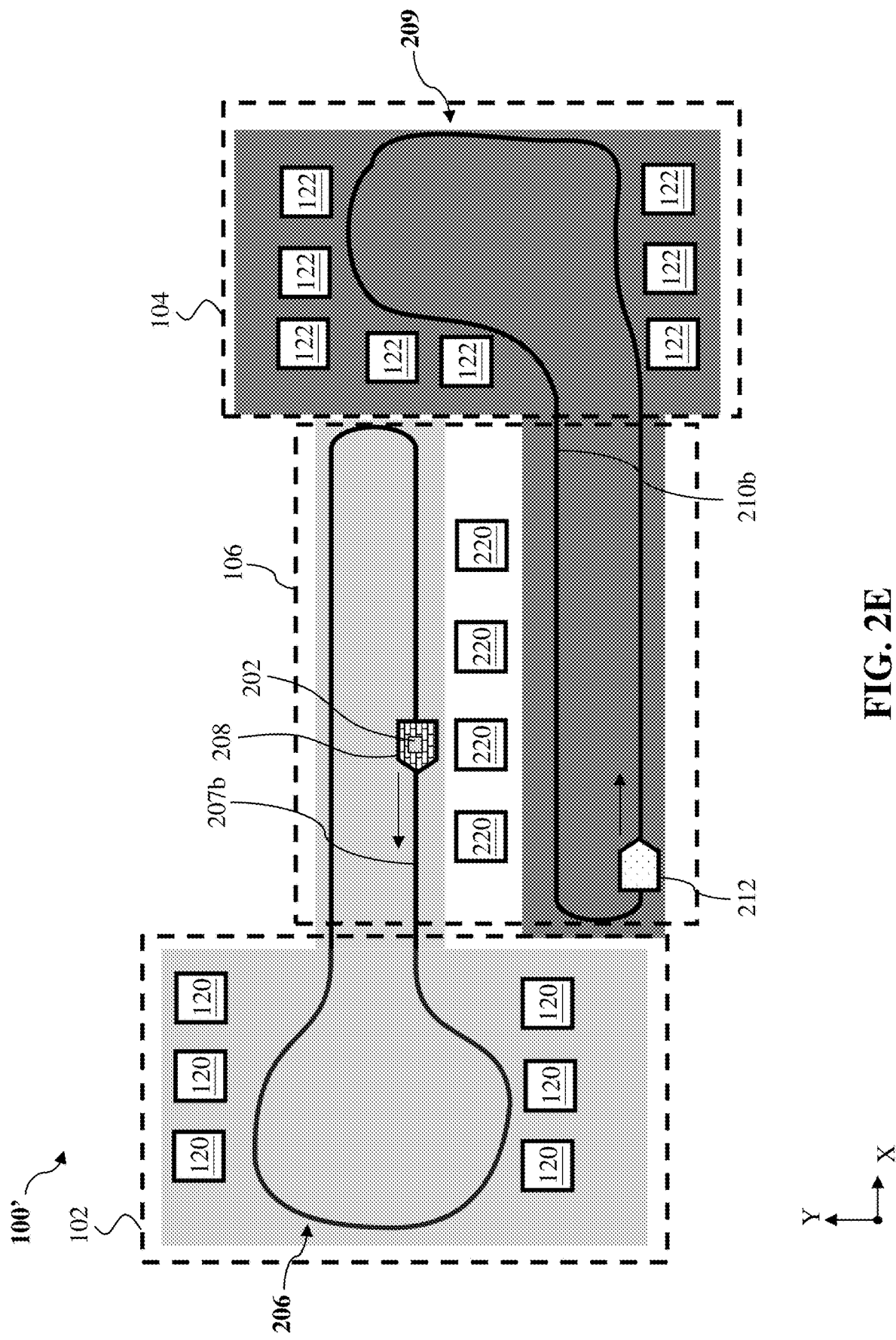
FIG. 2E is a simplified fragmentary schematic diagram illustrating another simplified manufacturing facility, according to one embodiment of the present disclosure.

FIG. 2E illustrates another manufacturing facility 100'. The manufacturing facility 100' is in a way similar to the manufacturing facility 100 except that the OHT system 206 of the manufacturing facility 100' is not in proximity of the OHT system 209 of the manufacturing facility 100', and the manufacturing facility 100' further includes interface devices 220 (e.g., stockers, conveyor, or other similar configurations) disposed between the two OHT systems. As such, a "cross-fab" transfer may include configuring the vehicle 212 placing the FOUP 202 on the interface device 220 that is used to temporarily hold the FOUP 202, and then configuring the vehicle 208 take the FOUP 202 from the interface device 220 to the processing tools or equipment in the fab 102. As such, comparing to the manufacturing facility 100, the manufacturing facility 100' may need more clean room space to accommodate those interface devices 220 to implement the "cross-fab" transfer.

Figure 3:
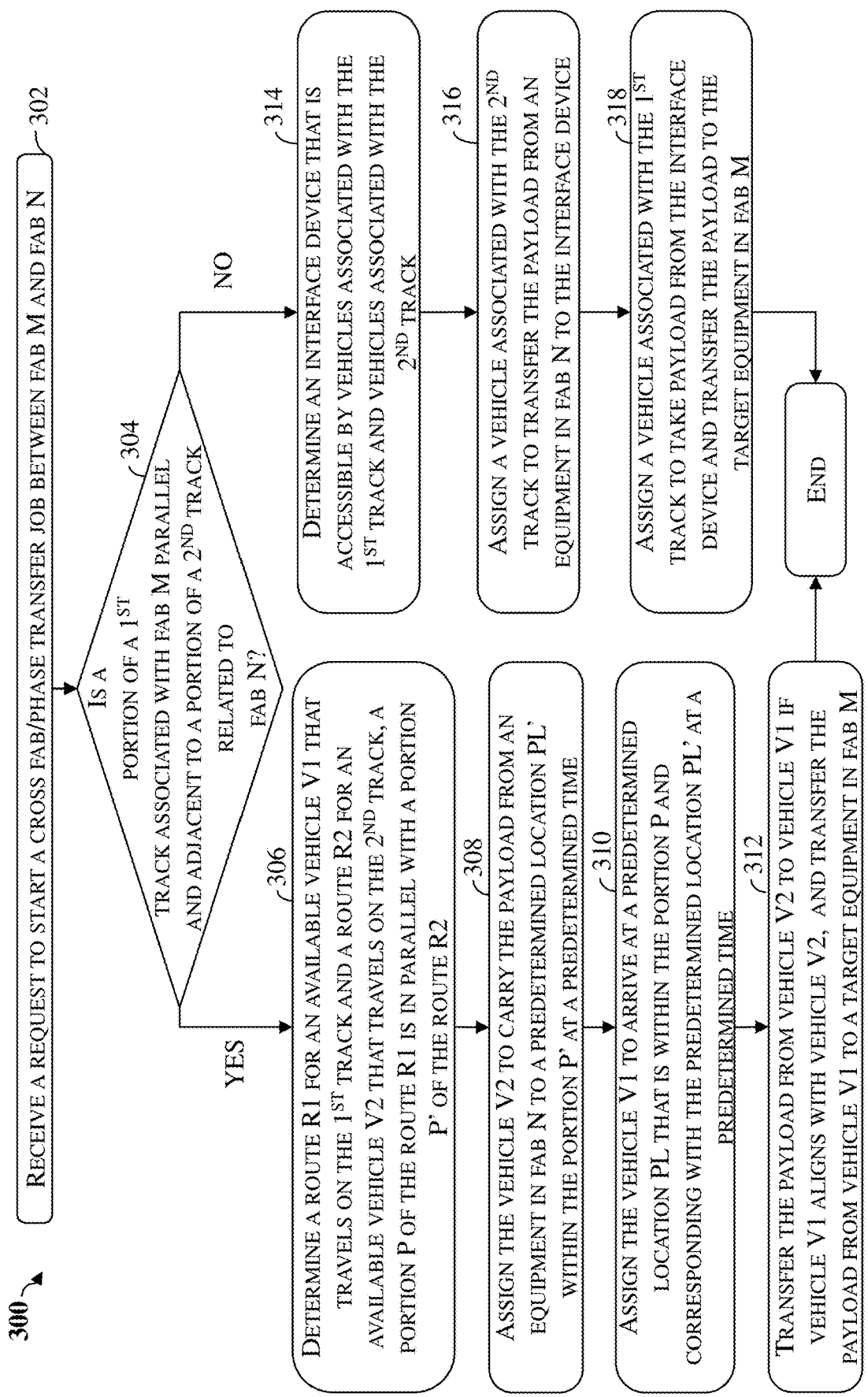
FIG. 3 depicts a flow chart illustrating an exemplary method of performing a cross-fab wafer transportation process as illustrated in FIGS. 2A-2D.

FIG. 3 depicts a flow chart illustrating an exemplary method of transferring a wafer between fabs. In this depicted example, a method 300 of configuring the manufacturing facility 100 and performing a cross-fab transfer process in the manufacturing facility 100 is introduced. At 302, a request of starting a wafer transfer job between fab M (e.g., the fab 104) and fab N (e.g., the fab 102) is received. The request may be received and processed by the unified control unit 126. For example, a request may be input by a user through a user interface of the unified control unit 126. In some embodiments, the request may be generated by some other control units used to facilitate the operation of the manufacturing facility 100.

After receiving the request of starting the cross-fab transfer job, the method 300 includes, at 304, determining, by the microprocessor 130, whether the overhead track of the OHT system of the fab M (e.g., the overhead track 210 of the OHT system 209 of the fab 104) has a portion that is adjacent to and in parallel with a portion of the overhead track of the OHT system of the fab N (e.g., the overhead track 207 of the OHT system 206 of the fab 102). In some embodiments, the microprocessor 130 is configured to perform operations such as retrieving and analyzing available routes for transferring the FOUP 202 from the fab M (e.g., fab 104) to the fab N (e.g., fab 102).

If the overhead track associated within the fab M has a portion (e.g., the portion 210b) that is adjacent to and in parallel with a portion (e.g., the portion 207b) of the overhead track associated with the fab N, then, at 306, the microprocessor 130 selects a route such that the transferring of the FOUP 202 may be performed without using the interface device 220 (shown in FIG. 2E). The transfer that doesn't use the interface device 220 may be referred to as a direct transfer, and the transfer that uses the interface device 220 may be referred to as an indirect transfer. In situations that there are multiple routes available for the direct transfer, the microprocessor 130 may select a route R from those multiple routes for the transferring of the FOUP 202 depending on, for example, the traffic, the route distances, and/or other factors. As described above, the full transfer route R of a FOUP between AMHSs may include sub-routes. In the present embodiments, the full transfer route R includes a sub-route R1 within the OHT system 206 of the fab 102 and a sub-route R2 within the OHT system 209 of the fab 104. The microprocessor 130 may further perform operations to provide the sub-routes (e.g., sub-route R1, sub-route R2) and sub-routes requests to each of the MCSs (e.g., MCS 110, MCS 116) of the fabs based on the selected route R.

The method 300 also includes, at 308, assigning a vehicle to carry the FOUP from an equipment of the fab N, move along the route R2 and arrive at a predetermined location at a predetermined time. The predetermined location is within the portion of the overhead track of the fab N that is in parallel with the overhead track of the fab M. For example, as represented in FIG. 2A, the vehicle 212 is configured to carry the FOUP from equipment 122, move along the overhead track 210, and arrive at the predetermined location 214 at a predetermined time. The predetermined location 214 is within the portion 210b.

The method 300 also includes, at 310, assigning a vehicle to move along the route R1 and arrive at a predetermined location at the predetermined time. The predetermined location is within the portion of the overhead track of the fab M that is in parallel with the overhead track of the fab N. For example, as represented in FIG. 2A, the vehicle 208 is configured to move along the overhead track 207 and arrive at the predetermined location 216 at the predetermined time. The predetermined location 216 is within the portion 207b.

The method 300 then proceeds to block 312 where the FOUP from the vehicle associated with the fab N is transferred to the vehicle associated with the fab M. For example, as exemplary represented in FIGS. 2B-2D, the FOUP which carries the wafers is transferred from the vehicle 212 to the vehicle 208. The direct transfer of wafer between the fab M and fab N is thus finished. Detailed operations that may be performed by the vehicles 208/212 to execute the transfer will be described in further detail with reference to FIG. 7.

At block 304, if the overhead track associated with the fab M doesn't have a portion that is adjacent to and in parallel with a portion of the overhead track associated with the fab N, then, at 314, the microprocessor 130 selects a route such that the transferring of the FOUP 202 may be performed using interface devices. For example, in embodiments represented in FIG. 2E, the overhead track 207 is not in proximity of the track 210, thus, the transfer between the fab 102 and the fab 104 of the manufacturing facility 100' will include the use of the interface device 220. At block 304, the microprocessor 130 may select an interface device that is accessible by both the OHT system of the fab M and the OHT system of the fab N. For example, in embodiments represented in FIG. 2E, the overhead track 207 of the OHT system 206 is not in proximity of the track 210 of the OHT system 209, thus, the wafer transfer between the fab 102 and the fab 104 of the manufacturing facility 100' will involve the use of the interface devices 220. One of the interface devices 220 may be selected to facilitate the transfer of the FOUP 202. The microprocessor 130 may then communicate the related sub-routes and the selected interface device with the MCSs of the fab M and the fab N.

After the information of the sub-routes and the selected interface device are received by the MCSs of the fab M and the fab N, the method 300 moves to block 316 where a vehicle associated with the OHT system of the fab N is configured to transfer the FOUP from an equipment in the fab N to the selected interface device. The method 300 also includes a block 318 where a vehicle associated with the OHT system of the fab M is configured to take the FOUP from the selected interface device to a target equipment in the fab M. The indirect transfer of wafer between the fab M and fab N is thus finished.

Figure 4:
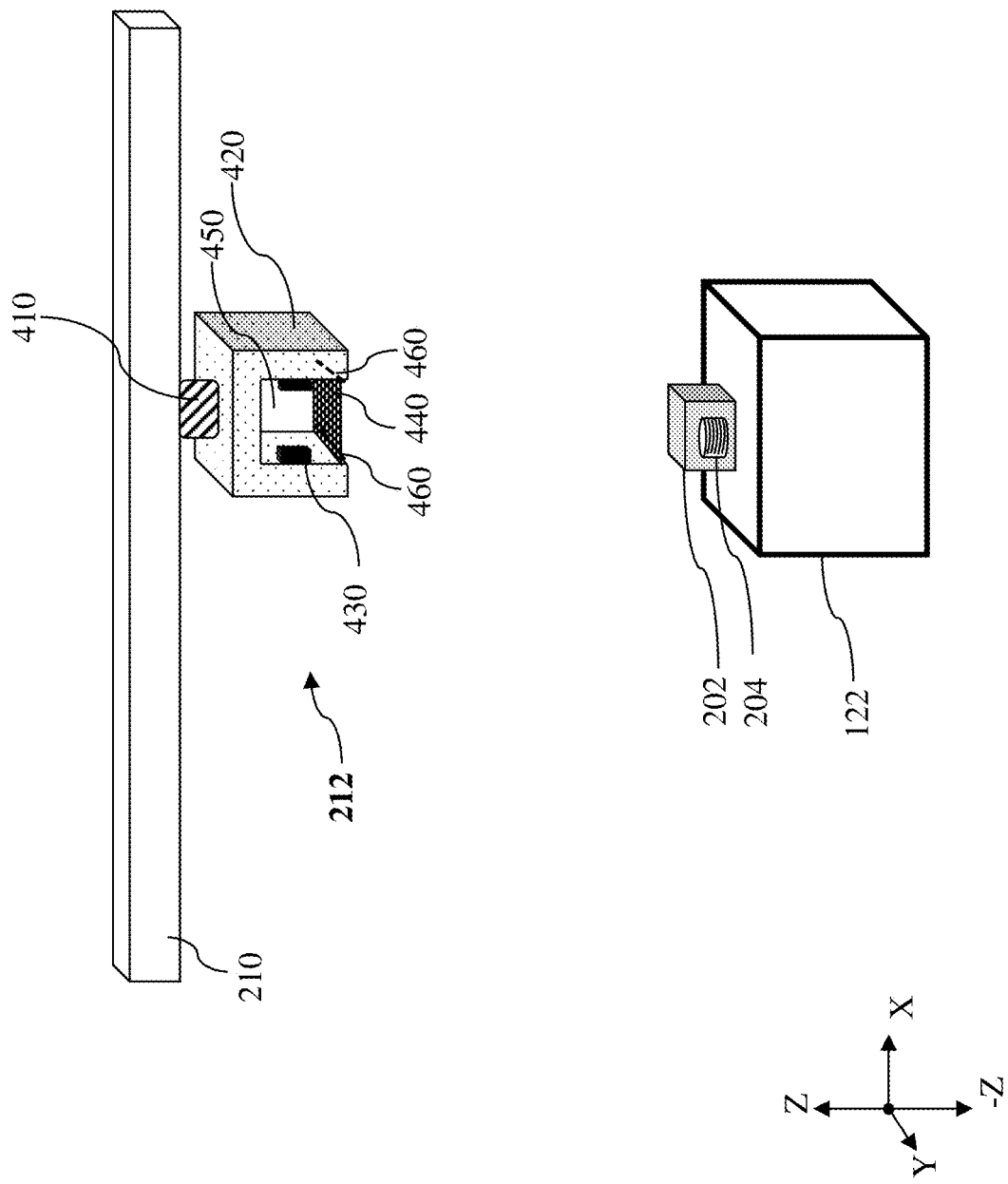
FIG. 4 shows an exemplary vehicle, according to one embodiment of the present disclosure.

Referring now to FIG. 4, an exemplary structure of the vehicle used in the OHT system of the fab is described. In some embodiments, the vehicle 212 and the vehicle 208 have substantially the same structure, and the structure of the vehicle 212 is described in the present embodiments. As shown in FIG. 4, the vehicle 212 is connected to the track 210 of the OHT system 209 via a connection device 410 such that the vehicle 212 may be operable to move along the track 210. The vehicle 212 includes a housing (or a main body) 420 and at least one (e.g., one, two, or more) gripper 430 configured to extend from the housing 420 to grab the FOUP 202 from the processing tool, interface equipment, another vehicle (such as vehicle 208), or other devices. The gripper 430 may be mechanically coupled to an outer surface of the housing 420 or an inner surface of the housing 420. The gripper 430 may be operable in multiple modes. For example, when the vehicle 212 is configured to take the FOUP 202 from an interface device, the gripper 430 may extend laterally (e.g., along the Y direction) and then vertically (along the –Z direction) to grab the FOUP 202. When the vehicle 212 is configured to take the FOUP 202 from the vehicle 208, and the vehicles 212 and 208 are in the same height, the gripper 430 may extend laterally (e.g., along the Y direction or the –Y direction) to grab the FOUP 202.

The vehicle 212 also includes a tray 440 that is configured to hold or carry the FOUP 202. For example, after the gripper 430 takes the FOUP 202 from the equipment 122 in the fab 104, the gripper 430 may put the FOUP 202 on the tray 440. The tray 440 and the housing 420 forms a cavity 450. The volume of the cavity 450 is larger than the volume of the FOUP 202 such that the FOUP 202 may be arranged in the cavity 450. In some embodiments, after taking the FOUP 202 from the equipment 122 in the fab 104, the gripper 430 may be retracted and placed in the cavity 450. In some embodiments, the vehicle 212 also includes a support member 460 positioned under the tray 440 and mechanically coupled to the housing 420. The tray 440 may be placed over and operable to slide on the support member 460. In situations that the vehicle 208 would take the FOUP 202 from the vehicle 212, the tray 440 of the vehicle may be configured to slide out from the main body of the vehicle 212 to facilitate the transfer process. In an embodiment, the vehicle 208 and the vehicle 212 have substantially the same structure, and repeated description related to the structure of the vehicle 208 is omitted for reason of simplicity.

Figure 5C:
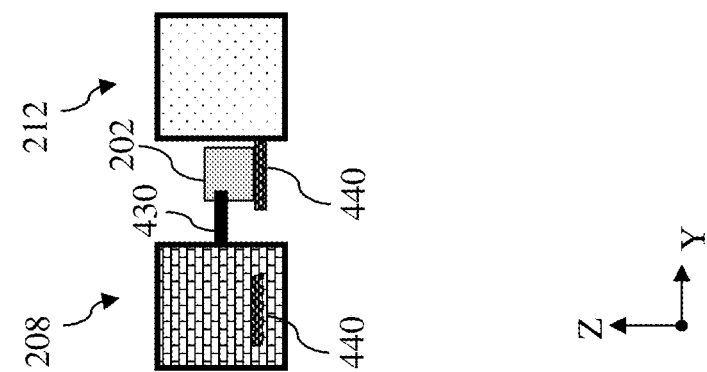
FIGS. 5A, 5B, and 5C illustrate simplified schematic diagrams of two vehicles operating in different modes during the cross-fab wafer transportation process, according to one embodiment of the present disclosure.
Figure 5B:
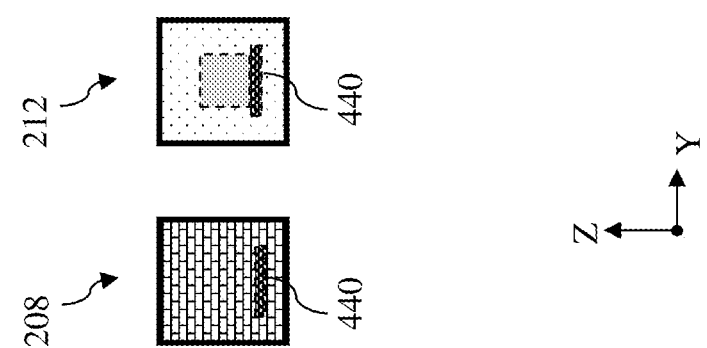
Figure 5A:
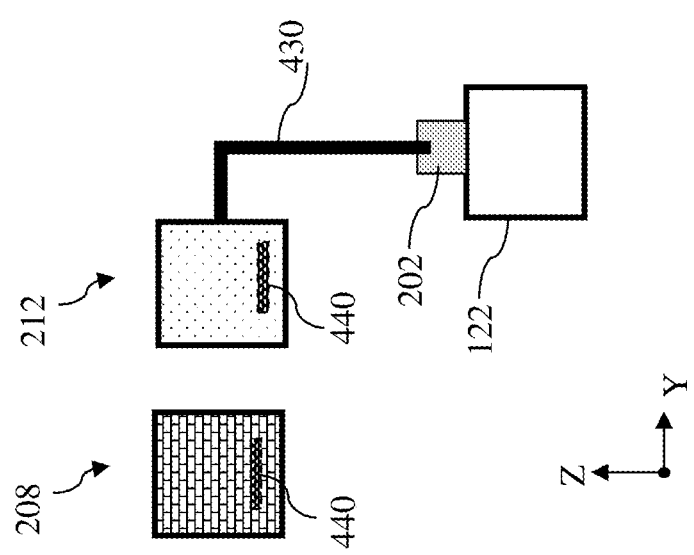

FIGS. 5A, 5B, and 5C illustrate simplified schematic diagrams of two vehicles operating in different modes during the cross-fab wafer transportation process. With reference to FIG. 5A, at the beginning of the cross-fab wafer transportation process, the vehicle 208 is configured to move along the overhead track 207 and the vehicle 212 is configured to take the FOUP 202 from the equipment 122. Each of the tray of the vehicle 208 and the tray of the vehicle 212 is available for the arrangement of the FOUP 202. The gripper 430 of the vehicle 212 is then configured to extended from the housing laterally and then vertically to take the FOUP 202 (or vertically if directly thereabove). Referring to FIG. 5B, after the vehicle 212 taking the FOUP 202, the FOUP 202 is placed on the tray 440, and the gripper 430 (not shown in FIG. 5B) of the vehicle 212 has been retracted. Referring to FIG. 5C, after the vehicle 208 and the vehicle 212 are aligned and stationary or relatively stationary, the tray 440 of the vehicle 212 slides out towards the vehicle 208, and the gripper 430 of the vehicle 208 extends laterally towards the vehicle 212 to take the FOUP 202 from the tray 440 of the vehicle 212. Although not shown in figures, after taking the FOUP 202, the gripper of the vehicle 208 may be retracted and the FOUP 202 may be placed on the tray 440 of the vehicle 208. The tray 440 of the vehicle 212 may be retracted after the FOUP 202 being taken away.

Figure 6:
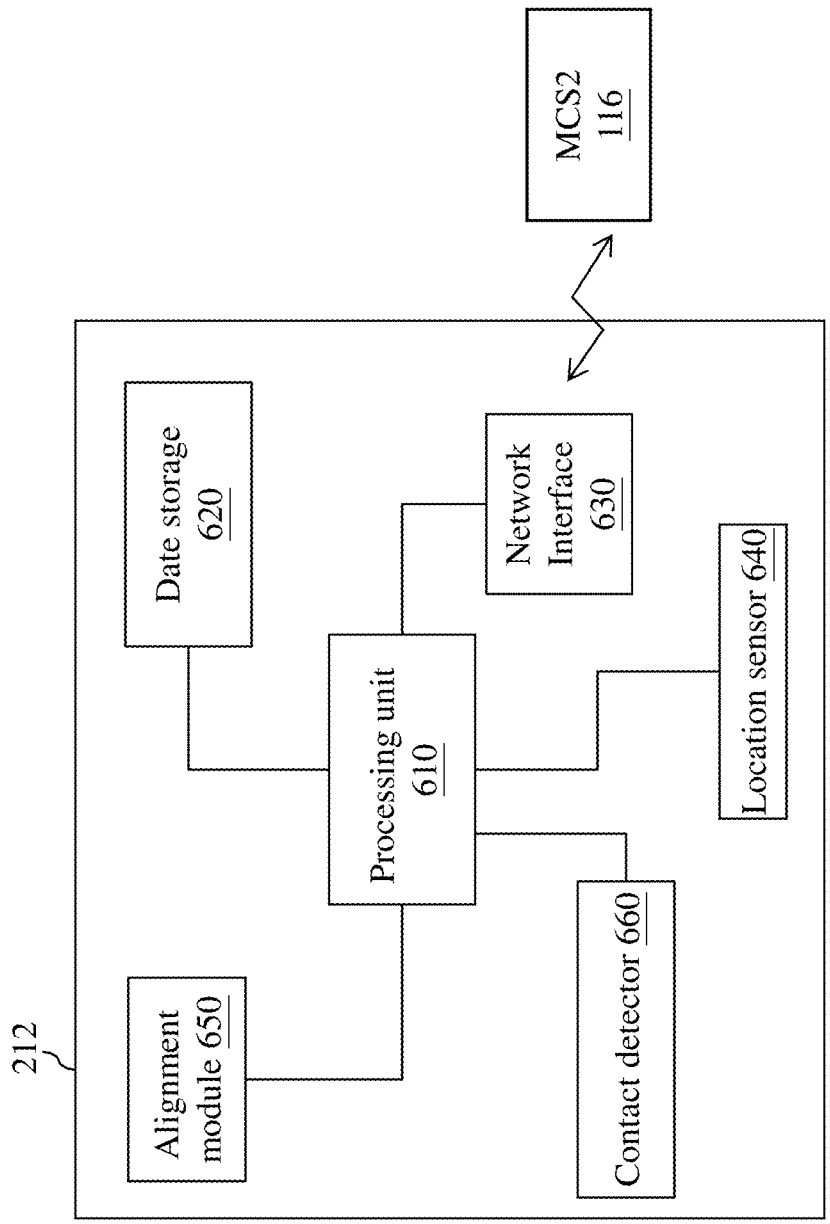
FIG. 6 depicts a block diagram of the vehicle, according to one embodiment of the present disclosure.

FIG. 6 depicts a block diagram of the vehicle 212, according to one embodiment of the present disclosure. In the present embodiments, the vehicle 212 includes a processing unit 610 configured to perform operations to execute the cross-fab wafer transfer. For example, the processing unit 610 may determine the operation of the gripper 430 and the operation of the tray 440. The processing unit 610 is coupled to data storage (e.g., a non-volatile memory (NVM)) 620. The data storage 620 may store instructions that, when executed by the processing unit 610, cause the processing unit 610 to perform operations to control the movement and speed of the vehicle, the operation of the gripper, the movement of the tray, for example. Detailed description of those operations are described with reference to FIG. 7. The data storage 620 may also include look-up tables (LUTs) to store one or more parameters/operations associated with one or more predetermined criteria. The predetermined criteria may include criteria corresponding to, for example, monitored or detected status parameters. The vehicle 212 also includes a network interface 630 operably connected to the processing unit 610 to provide interconnection between the vehicle 212 and the MCS 116. The processing unit 610 may transmit, via the network interface 630, information such as location and the tray's availability status of the vehicle to the MCS 116. The processing unit 610 may receive via the network interface 630, signals such as sub-route requests from the MCS 116 that was generated by the microprocessor 130.

The vehicle 212 also includes a location sensor 640 operably connected to the processing unit 610. During operation, the location sensor 640 may provide location information of the vehicle 212 to the processing unit 610. Based on the location information, the processing unit 610 may perform different operations. The vehicle 212 also includes an alignment module 650 coupled to the processing unit 610 to determine whether the vehicle 212 is aligned with the predetermined object (e.g., the vehicle 208). In some embodiments, the alignment module 650 may include an image sensor, a laser sensor, a tilt-angle sensor, other suitable devices, and/or combinations thereof. In some embodiments, the vehicle 212 may also include a contact detector 660 configured to determine whether the gripper of the vehicle is in full contact with the FOUP. For example, in embodiments represented in FIG. 5A, the vehicle 212 may retract its gripper after determining, by the contact detector, that the gripper 430 is in full contact with the FOUP 202. It is understood that the vehicle 212 may have fewer or greater components as would be apparent to one skilled in the art. For example, the vehicle 212 may also include a power engine that controls the power applied to the vehicle 212. For example, the vehicle 212 may also include a display that may be configured to show a bar code, an image, a QR code or other suitable information such that the other vehicle may use alignment module to detect or scan the information ("alignment mark") shown on the display to determine the alignment between these two vehicles.

Figure 7:
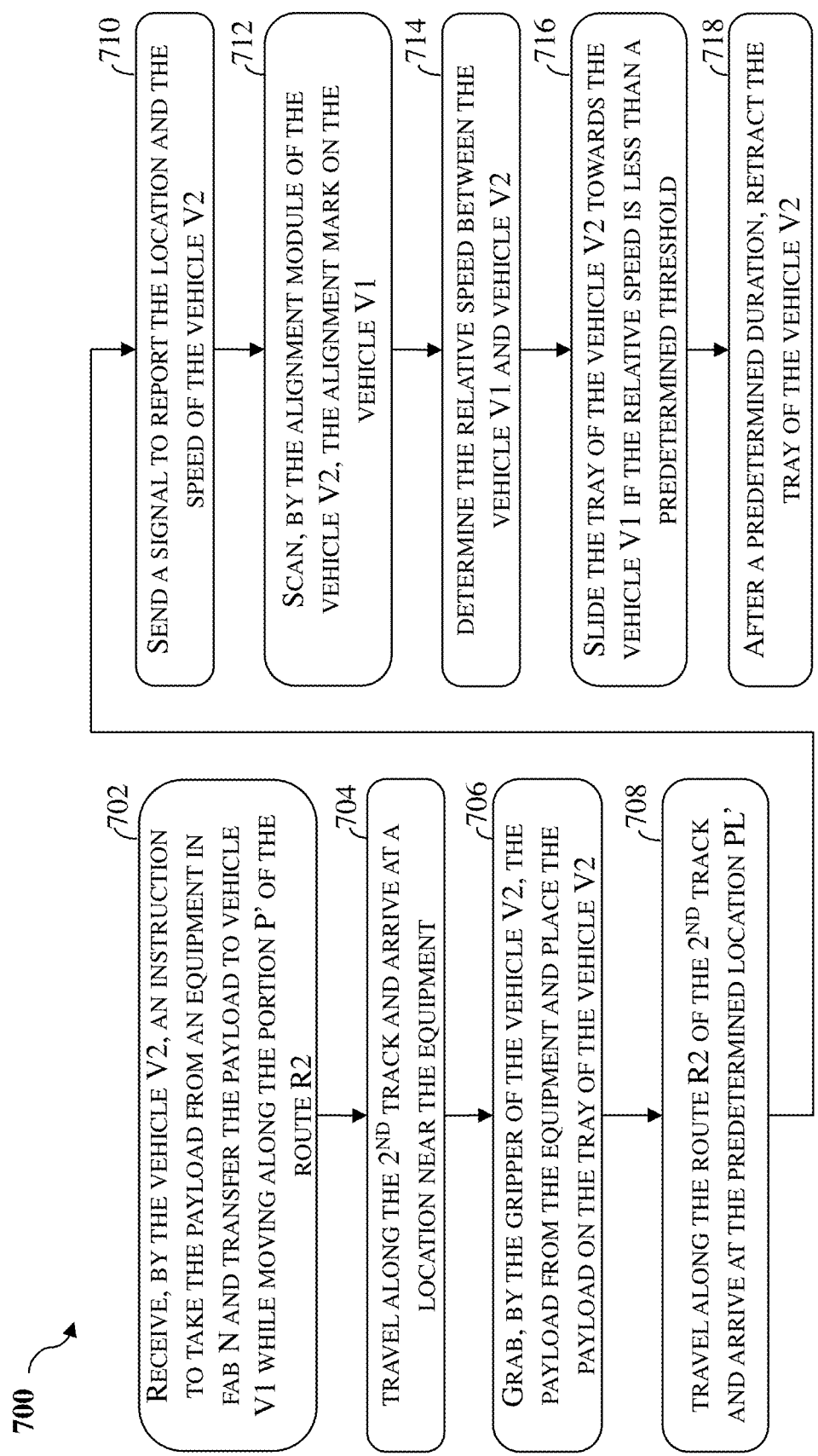
FIG. 7 depicts a flow chart illustrating an exemplary method of configuring a vehicle to perform operations to conduct the cross-fab wafer transportation process, according to one embodiment of the present disclosure.

FIG. 7 depicts a flow chart illustrating an exemplary method 700 of configuring a vehicle 212 to perform operations to conduct the cross-fab wafer transportation process, according to one embodiment of the present disclosure. The method 700 includes, at 702, receiving an instruction, by the vehicle 212, to take a FOUP 202 from an equipment in the fab 104 and transfer the FOUP 202 to the vehicle 208 when the vehicle 212 is moving along the portion 210b. In some embodiments, the instruction may include one of the sub-route requests received from the microprocessor 130.

After receiving the instruction, at 704, the vehicle 212 is configured to move along the track 210 of the OHT system 209 to arrive at a location that is in proximity of the equipment that is holding the FOUP. The method 700 proceeds to block 706 where the vehicle 212 is configured to grab (by the gripper 430) the FOUP 202 from the equipment and carry the FOUP 202. In an embodiment, after grabbing the FOUP 202, the gripper 430 may place the FOUP 202 on the tray 440 of the vehicle 212. After taking the FOUP 202, at 708, the vehicle 212 is configured to move along the route R2 (e.g., track 210) and arrive at the predetermined location (e.g., the predetermined location 214 shown in FIG. 2A) within the portion 210b. In some embodiments, at 710, after arriving at the predetermined location 214, the vehicle 212 may send its location information to the MCS 116, and the MCS 116 may send the location information to the unified control unit 126. In some embodiments, the travel speed of the vehicle 212 may also be transmitted to the unified control unit 126, via the MCS 116.

Once both the vehicle 212 and the vehicle 208 have arrived at its respective predetermined location (e.g., predetermined location 216 for the vehicle 208, predetermined location 214 for the vehicle 212), at 712, the vehicle 212 is configured to scan, for example, using the alignment module 650, the alignment mark of the vehicle 208. Besides performing the alignment check, in some embodiments, the vehicle 212 may also determine whether the travelling speed of the vehicle 212 is substantially equal to the travelling speed of the vehicle 208. As described above, on conditions that the vehicle 212 and the vehicle 208 are aligned and travelling at substantially the same speed along a same direction, at 716, the vehicle 212 is configured to slide its tray out from the housing and towards the vehicle 208. In some embodiments, the method 700 may also include, at 718, after a predetermined duration, retracting the tray of the vehicle 212. In the present embodiments, operations performed by the vehicle 212 are described. It is understood that the vehicle 212 may perform fewer or greater operations as would be apparent to one skilled in the art. The operations that can be performed by the vehicle 208 during the cross-fab wafer transportation would be apparent to one skilled in the art.

In the above embodiments, the FOUP is transferred from the vehicle 212 to the vehicle 208 when both vehicles are moving along their respective track along the same direction (e.g., −X direction shown in FIG. 2B) and at substantially the same speed. In some other embodiments, the vehicle 212 and the vehicle 208 may move along different directions, and when the vehicle 212 is in proximity of the vehicle 208, the speed of the vehicle 212 and/or the speed of the vehicle 208 may be reduced to facilitate the FOUP transfer. That is, in some implementations, the overhead track 207 may don't have a portion that is adjacent to and in parallel with a portion of the overhead track 210. For example, the overhead track 207 has a portion that is in proximity of a portion of the overhead track 210. When the vehicle 208 arrives at its predetermined location within the portion of the overhead track 207, the vehicle 208 may stop at its predetermined location, and when the vehicle 212 arrives at its predetermined location within the portion of the overhead track 210, the vehicle 212 may stop at its predetermined location, and the FOUP may be then transferred from the vehicle 212 to the vehicle 208 when both the vehicle 212 and the vehicle 208 are stationary.

Figure 8:
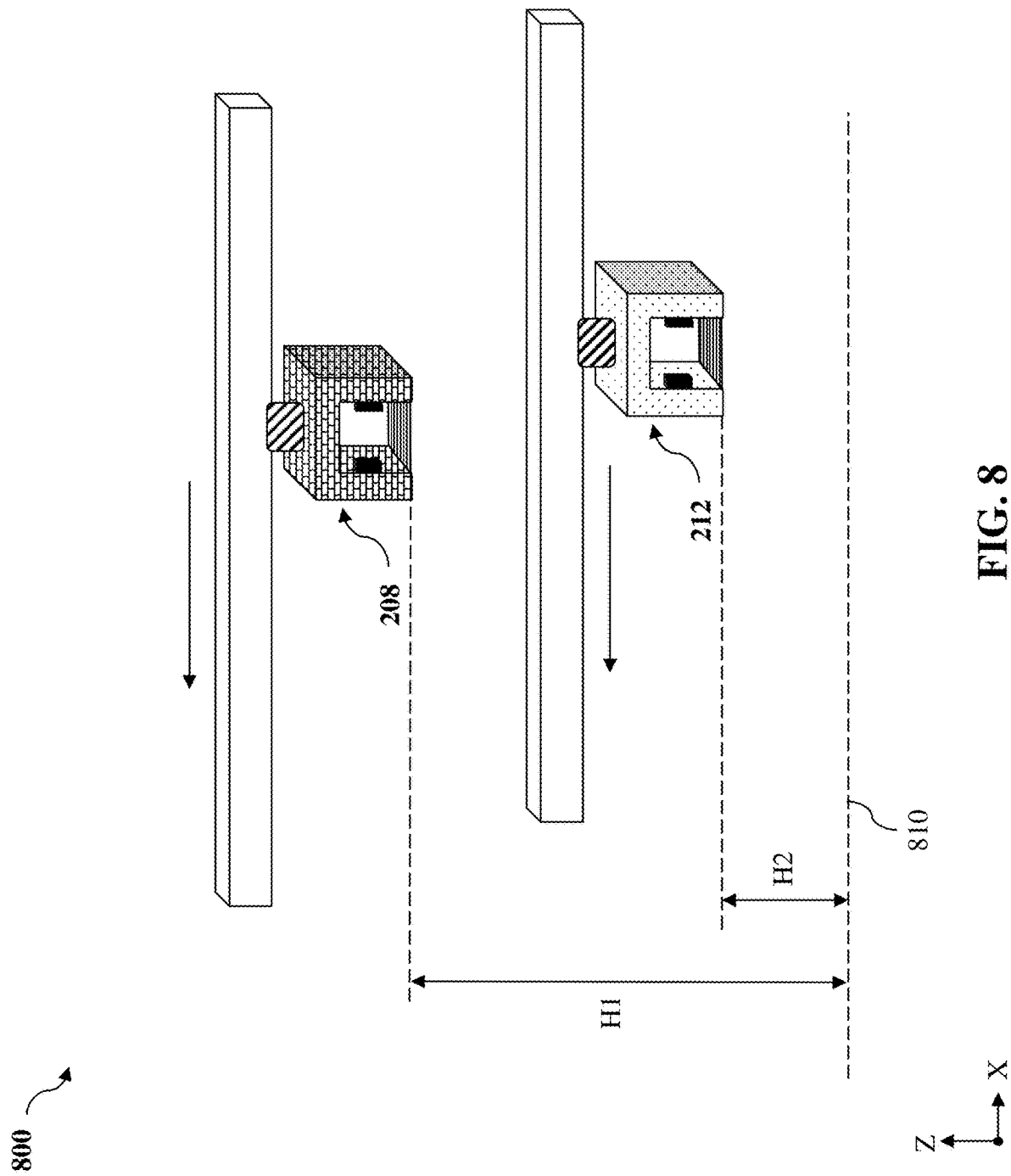
FIG. 8 is a simplified fragmentary schematic diagram of an alternative system for facilitating the cross-fab wafer transportation process, according to another embodiment of the present disclosure.

FIG. 8 is a simplified fragmentary schematic diagram of an alternative system for facilitating the cross-fab wafer transportation process, according to another embodiment of the present disclosure. In the above embodiments described with reference to FIGS. 2A-2D, the vehicle 212 and the vehicle 208 are at the same height. In some embodiments, the vehicle 212 and the vehicle 208 may be at different heights. For example, in embodiments represented in FIG. 8, a distance H2 between the vehicle 212 and a floor 810 is less than a distance H1 between the vehicle 208 and the floor 810. In such situation, when taking the FOUP from the vehicle 212, the gripper of the vehicle 208 may first extend laterally and then extend vertically downward to take the FOUP 202 from the tray of the vehicle 212.

Although not intended to be limiting, one or more embodiments of the present disclosure provide many benefits to cross-fab transportation. For example, the present disclosure provides a method for performing a cross-fab transportation without putting a wafer carrier temporarily on a stoker or other interface devices. As such, the cross-fab transportation is simplified. In addition, the manufacturing facility doesn't need interface devices arranged in a bridging area. Also, the traffic jam caused by temporarily putting the wafer carrier on the interface devices and then taking the wafer carrier from the interface devices may be reduced. One or more embodiments of the present disclosure may be applied in a cross-phase transportation, a cross-AMHS transportation.

The present disclosure provides for many different embodiments. Semiconductor structures and methods of fabrication thereof are disclosed herein. In one exemplary aspect, the present disclosure is directed to a system. The system includes a first control system coupled to an associated first automatic material handling system (AMHS). The first AMHS includes a first overhead transfer (OHT) track comprising a first portion, a first vehicle movable along the first OHT track and carrying a container, the container is operable to carry semiconductor wafers therein. The system also includes a second control system coupled to an associated second AMHS. The second AMHS includes a second OHT track comprising a second portion adjacent to the first portion and a second vehicle movable along the second OHT track. On condition that the first vehicle is within the first portion of the first OHT track, and the second vehicle is within the second portion of the second OHT track, the first and second vehicles are operable to transfer the container directly from the first vehicle to the second vehicle.

In some embodiments, the first vehicle may be operable to move along the first portion with a first speed and the second vehicle may be operable to move along the second portion with a second speed, the first speed may be substantially equal to the second speed during transferring the container. In some embodiments, the first portion of the first OHT track and the second portion of the second OHT track may be substantially parallel, such that the first vehicle and the second vehicle are operable to move along a same direction. In some embodiments, the second vehicle may be operable to take the container directly from the first vehicle when both the first vehicle and the second vehicle are stationary. In some embodiments, the first portion and the second portion may be substantially at a same height. In some embodiments, the first portion and the second portion may be at different heights. In some embodiments, the first vehicle may include at least a gripper operable to take the container from an interface equipment and a tray configured to hold the container before the container being transferred to the second vehicle. In some embodiments, the first vehicle may include a processing unit, a data storage coupled to the first processing unit and containing a program of instructions that, when executed by the processing unit, cause the first vehicle to perform operations to take the container from an interface equipment and transfer the container to the second vehicle. The operations may include receiving a signal from the first control system, in response to the signal, arriving at a first predetermined location, gripping the container from the predetermined location, after gripping the container, moving along the first OHT track and arriving at a second predetermined location at a predetermined time, the second predetermined location being within the first portion, and after aligning with the second vehicle, passing the container to the second vehicle. In some embodiments, the container may include a front opening universal pod (FOUP).

In another exemplary aspect, the present disclosure is directed to a system for wafer transportation between two fabs. The system includes a container arranged in a first fab and operable to carry semiconductor wafers, a target equipment arranged in a second fab, a bridging area between the first fab and the second fab, a first overhead transfer (OHT) track comprising a first portion in the first fab and a second portion in the bridging area, a first vehicle operable to carry the container and move along the first OHT track, a second OHT track comprising a first portion in the second fab and a second portion in the bridging area, wherein the second portion of the second OHT track is in parallel with the second portion of the first OHT track, and a second vehicle configured to move along the second OHT track. The second vehicle is operable to take the container directly from the first vehicle when both the first vehicle and the second vehicle are in the bridging area.

In some embodiments, the first vehicle may be configured to travel along the second portion of the first OHT track at a first speed, the second vehicle may be configured to travel along the second portion of the second OHT track at a second speed, a speed difference between the first speed and the second speed is less than 0.1 m/sec during taking the container. In some embodiments, the first vehicle may be configured to travel along the first portion of the first OHT track at a third speed, the third speed may be different from the first speed. In some embodiments, the first vehicle may include an alignment mark, the second vehicle may include an alignment mark detector, and the second vehicle may be configured to take the container directly from the first vehicle after the alignment mark detector detects the alignment mark. In some embodiments, the system may also include a first control system configured to directly communicate with the first vehicle, a second control system configured to directly communicate with the second vehicle, and a master control system configured to communicate with the first control system and the second control system. The first vehicle may be configured to report its location to the first control system, and the first control system may report the location to the master control system.

In yet another exemplary aspect, the present disclosure is directed to a method. The method includes selecting a wafer at a first location in a first fab for transferring to a second fab, the first fab comprising a first automatic material handling system (AMHS) that includes a first overhead transfer (OHT) track and a first vehicle movable along the first OHT track, the second fab comprising a second AMHS that includes a second OHT track and a second vehicle movable along the second OHT track, determining whether the first OHT track has a first portion that is in proximity of a second portion of the second OHT track. If the first OHT track has a first portion that is in proximity of a second portion of the second OHT track, then determining a first route for the first vehicle, the first route including the first portion, determining a second route for the second vehicle, the second route including the second portion, configuring the first vehicle to carry the wafer from the first location, travel along the first route, and arrive at a first predetermined location within the first portion in a predetermined time period, configuring the second vehicle to travel along the second route and arrive at a second predetermined location within the second portion in the predetermined time period, determining whether the first vehicle aligns with the second vehicle, and if the first vehicle aligns with the second vehicle, then instructing the first vehicle and the second vehicle to start wafer transfer between the first vehicle and the second vehicle.

In some embodiments, the method may also include, after the first vehicle arriving at the first predetermined location, configuring the first vehicle to move along the first portion at a first speed, after the second vehicle arriving at the second predetermined location, configuring the second vehicle to move along the second portion at a second speed, and the first speed may be substantially equal to the second speed. In some embodiments, the method may also include after the first vehicle arriving at the first predetermined location, configuring the first vehicle to stay at the first predetermined location, and after the second vehicle arriving at the second predetermined location, configuring the second vehicle to stay at the second predetermined location. In some embodiments, the determining of whether the first vehicle aligns with the second vehicle may include determining whether a detection module of the first vehicle catches an alignment mark on the second vehicle. In some embodiments, the method may also include, if the first vehicle aligns with the second vehicle, determining whether a speed difference between a speed of the first vehicle and a speed of the second vehicle is less than a predetermined threshold, and if the speed difference is less than the predetermined threshold, then instructing the first vehicle to provide the wafer from a tray of the first vehicle and instructing the second vehicle to take the wafer from the tray. In some embodiments, the method may also include, if the first OHT track does not have a portion that is parallel with and adjacent to a portion of the second OHT track, then selecting an interface device that is accessible by a vehicle associated with the first OHT track and a vehicle associated with the second OHT track, configuring the vehicle associated with the first OHT track to transfer the wafer to the interface device, and configuring the vehicle associated with the second OHT track to take the wafer from the interface device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a first control system coupled to an associated first automatic material handling system (AMHS), the first AMHS comprising:
   a first overhead transfer (OHT) track comprising a first portion;
   a first vehicle movable along the first OHT track and carrying a container, the container is operable to carry semiconductor wafers therein; and
   a second control system coupled to an associated second AMHS, the second AMHS comprising:
   a second OHT track comprising a second portion adjacent to the first portion; and
   a second vehicle movable along the second OHT track,
   wherein, the first and second vehicles are operable to transfer the container directly from the first vehicle to the second vehicle, and
   wherein, the first vehicle is operable to move along the first portion at a first speed and the second vehicle is operable to move along the second portion at a second speed, the first speed is substantially equal to the second speed during the transfer of the container.

2. The system of claim 1, wherein the first portion of the first OHT track and the second portion of the second OHT track are substantially parallel, and the first vehicle and the second vehicle are operable to move along a same direction.

3. The system of claim 1, wherein both the first vehicle and the second vehicle are stationary during the transfer of the container.

4. The system of claim 1, wherein the first portion and the second portion are substantially at a same height.

5. The system of claim 1, wherein the first portion and the second portion are at different heights.

6. The system of claim 1, wherein the first vehicle comprises:
   at least a gripper operable to take the container from an interface equipment, and
   a tray configured to hold the container before the container being transferred to the second vehicle.

7. The system of claim 1, wherein the first vehicle comprises:
   a processing unit;
   a data storage coupled to the first processing unit and containing a program of instructions that, when executed by the processing unit, cause the first vehicle to perform operations to take the container from an interface equipment and transfer the container to the second vehicle, the operations comprising:
   receiving a signal from the first control system;
   in response to the signal, arriving at a first predetermined location;
   gripping the container from the predetermined location;
   after gripping the container, moving along the first OHT track and arriving at a second predetermined location at a predetermined time, the second predetermined location being within the first portion; and
   after aligning with the second vehicle, passing the container to the second vehicle.

8. The system of claim 1, wherein the container comprises a front opening universal pod (FOUP).

9. A system for wafer transportation between two fabs, comprising:
   a container arranged in a first fab and operable to carry semiconductor wafers;
   a target equipment arranged in a second fab;
   a bridging area between the first fab and the second fab;

a first overhead transfer (OHT) track comprising a first portion in the first fab and a second portion in the bridging area;

a first vehicle operable to carry the container and move along the first OHT track;

a second OHT track comprising a first portion in the second fab and a second portion in the bridging area, wherein the second portion of the second OHT track is in parallel with and adjacent to the second portion of the first OHT track; and a second vehicle configured to move along the second OHT track, wherein, the first vehicle is configured to move along the second portion of the first OHT track towards a first direction, and the second vehicle is configured to move along the second portion of the second OHT track towards the first direction, and the second vehicle is operable to take the container directly from the first vehicle.

10. The system of claim 9, wherein the first vehicle is configured to travel along the second portion of the first OHT track at a first speed, the second vehicle is configured to travel along the second portion of the second OHT track at a second speed, a speed difference between the first speed and the second speed is less than 0.1 m/sec during taking the container.

11. The system of claim 10, wherein the first vehicle is configured to travel along the first portion of the first OHT track at a third speed, the third speed is different from the first speed.

12. The system of claim 10, further comprising:
a first control system configured to directly communicate with the first vehicle;
a second control system configured to directly communicate with the second vehicle; and
a master control system configured to communicate with the first control system and the second control system,
wherein the first vehicle is configured to report its location to the first control system, and the first control system further reports the location to the master control system.

13. The system of claim 9, wherein the first vehicle comprises an alignment mark, the second vehicle comprises an alignment mark detector configured to detect the alignment mark.

14. The system of claim 9, wherein the bridging area extends lengthwise along the first direction.

15. A method, comprising:
selecting a wafer at a first location in a first fab for transferring to a second fab, the first fab comprising a first automatic material handling system (AMHS) that includes a first overhead transfer (OHT) track and a first vehicle movable along the first OHT track, the second fab comprising a second AMHS that includes a second OHT track and a second vehicle movable along the second OHT track;

determining whether the first OHT track has a first portion that is in proximity of a second portion of the second OHT track;

if the first OHT track does not have a portion that is in proximity of a portion of the second OHT track, instructing the first vehicle to send the wafer to an interface device; and if the first OHT track has a first portion that is in proximity of a second portion of the second OHT track, then:
determining a first route for the first vehicle, the first route including the first portion;
determining a second route for the second vehicle, the second route including the second portion;
configuring the first vehicle to carry the wafer from the first location, travel along the first route, and arrive at a first predetermined location within the first portion in a predetermined time period;
configuring the second vehicle to travel along the second route and arrive at a second predetermined location within the second portion in the predetermined time period; and
instructing the first vehicle and the second vehicle to start wafer transfer between the first vehicle and the second vehicle.

16. The method of claim 15, further comprising:
after the first vehicle arriving at the first predetermined location, configuring the first vehicle to move along the first portion at a first speed;
after the second vehicle arriving at the second predetermined location, configuring the second vehicle to move along the second portion at a second speed; and
wherein the first speed is substantially equal to the second speed.

17. The method of claim 15, further comprising:
after the first vehicle arriving at the first predetermined location, configuring the first vehicle to stay at the first predetermined location; and
after the second vehicle arriving at the second predetermined location, configuring the second vehicle to stay at the second predetermined location.

18. The method of claim 15, further comprising: if the first OHT track has the first portion that is in proximity of the second portion of the second OHT track, then further determining whether a detection module of the first vehicle catches an alignment mark on the second vehicle.

19. The method of claim 15, further comprising:
determining whether a speed difference between a speed of the first vehicle and a speed of the second vehicle is less than a predetermined threshold.

20. The method of claim 15, further comprising:
if the first OHT track does not have a portion that is parallel with and adjacent to a portion of the second OHT track, then
further instructing the second vehicle to take the wafer from the interface device.

* * * * *